(12) United States Patent
Nathawad

(10) Patent No.: US 8,107,913 B1
(45) Date of Patent: Jan. 31, 2012

(54) METHOD AND APPARATUS FOR A DIGITAL REGULATED LOCAL OSCILLATION (LO) BUFFER IN RADIO FREQUENCY CIRCUITS

(75) Inventor: Lalitkumar Nathawad, Fremont, CA (US)

(73) Assignee: Qualcomm Atheros, Inc., San Jose, CA (US)

( * ) Notice: Subject to any disclaimer, the term of this patent is extended or adjusted under 35 U.S.C. 154(b) by 440 days.

(21) Appl. No.: 12/437,442

(22) Filed: May 7, 2009

(51) Int. Cl.
*H04B 1/06* (2006.01)
(52) U.S. Cl. ........................................ 455/255; 455/256
(58) Field of Classification Search .................. None
See application file for complete search history.

(56) References Cited

U.S. PATENT DOCUMENTS

| | | | | |
|---|---|---|---|---|
| 7,012,472 B2 * | 3/2006 | Xu et al. | ........................... | 331/16 |
| 7,795,967 B2 * | 9/2010 | Nakai et al. | ................... | 330/129 |
| 7,986,926 B2 * | 7/2011 | Rafi et al. | ....................... | 455/118 |
| 2003/0001684 A1 * | 1/2003 | Magoon et al. | ................ | 331/182 |
| 2006/0197616 A1 * | 9/2006 | Chen | ................................ | 331/74 |

* cited by examiner

*Primary Examiner* — Cassandra Cox
(74) *Attorney, Agent, or Firm* — DeLizio Gilliam, PLLC

(57) ABSTRACT

A digital regulated Local Oscillator (LO) buffer receives an unregulated LO signal from a local oscillator to create a regulated LO signal. Embodiments include not only the digital regulated LO buffer, but also a transceiver and/or a receiver including at least one instance of the digital LO buffer. They may be implemented as an integrated circuit. The digital regulated LO Buffer may include: A LO buffer receiving the unregulated LO signal and an amplitude control signal to create the regulated LO signal. A peak detector receives the regulated LO signal to create an analog peak signal that is presented to a digital output comparator along with a reference amplitude signal to create a digital threshold detect signal. An amplitude controller receives the digital threshold detect signal to create a digital control signal that drives a digitally controlled source to create the amplitude control signal.

22 Claims, 5 Drawing Sheets

US 8,107,913 B1

METHOD AND APPARATUS FOR A DIGITAL REGULATED LOCAL OSCILLATION (LO) BUFFER IN RADIO FREQUENCY CIRCUITS

TECHNICAL FIELD

This invention relates to radio circuits with a Local Oscillator (LO) Buffer using a digital automatic amplitude control.

BACKGROUND OF THE INVENTION

Radio frequency (RF) designs typically use a local oscillator (LO) to generate a signal that may be used, through signal processing techniques, to recover (receive) or transmit baseband signals. For example, the LO signal may be mixed with a baseband signal to create a second signal that may be an intermediate frequency (in the case of a double conversion transmitter) or may be a signal ready for transmission (in the case of a direct conversion transmitter). Similarly in the receive case, the LO signal may be mixed with a received signal to create an intermediate frequency or a baseband signal. Oftentimes, the LO signal is buffered to more effectively distribute the signal to locations within an integrated circuit.

LO buffers often suffer from many shortcomings. For example, the gain of Local Oscillator (LO) buffers may vary significantly, due to manufacturing process, temperature and power supply variations. These problems have been addressed in the prior art using analog regulated LO buffers, but the prior art may have a disadvantage of having a relatively noisy output. Consequently, what is needed is a LO buffer with relatively less noise.

SUMMARY OF THE INVENTION

The invention includes hardware embodiments that include a regulated LO buffer that may include the following: A LO buffer receiving an unregulated LO signal and an amplitude control signal to create a regulated LO signal. A peak detector receives the regulated LO signal to create an analog peak signal that is presented to a digital output comparator along with a reference amplitude signal to create a digital threshold detect signal. An amplitude controller receives the digital threshold detect signal to create a digital control signal that drives a digitally controlled source to create the amplitude control signal. This removes noise from the regulated LO signal while guaranteeing its amplitude, preferably when the amplitude controller alters the digital control signal infrequently, for example no more than once a second, during initialization and/or between the reception of packets.

The amplitude controller may include at least one instance of a finite state machine and/or a computer. The digitally controlled source may include a Digital to Analog Converter, a current source and/or a voltage source. The radio frequency interface may include and/or use a radio antenna and/or a low noise amplifier. Any of the components that are used may be included in the radio frequency interface.

DETAILED DESCRIPTION

The invention relates to radio circuits with a Local Oscillator (LO) Buffer using a digital automatic amplitude control. The invention includes hardware embodiments that include a digital regulated Local Oscillator (LO) buffer. The digital regulated LO buffer receives an unregulated LO signal from a local oscillator to create a regulated LO signal for mixing with an input signal to create a baseband signal. The embodiments may include not only the digital regulated LO buffer, but also a transceiver and/or a receiver including at least one instance of the digital LO buffer. These various embodiments may be implemented as an integrated circuit. The receiver may implement a direct conversion or a double conversion receiver. The direct conversion receiver may refer to a homodyne receiver. The double conversion receiver may refer to a super-heterodyne receiver.

Figure 1:
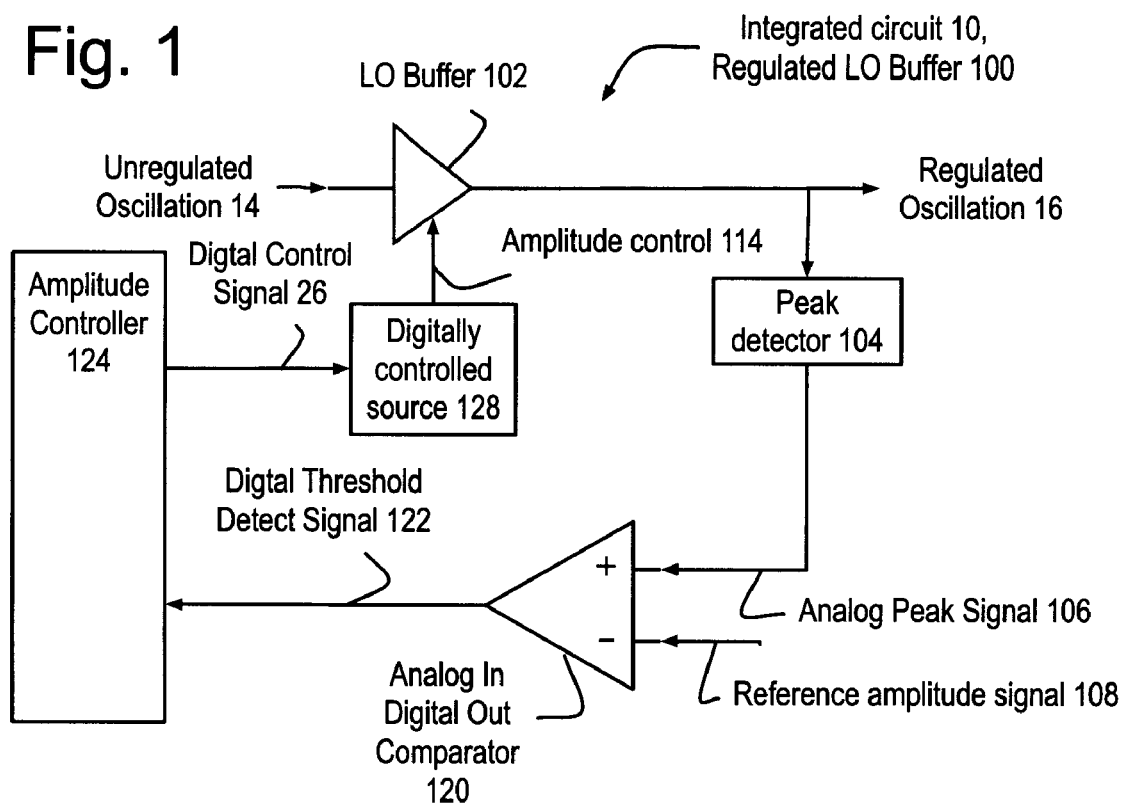
FIG. 1 shows the regulated LO buffer may include the following: A LO buffer receiving an unregulated LO signal and an amplitude control signal to create a regulated LO signal. A peak detector receives the regulated LO signal to create an analog peak signal presented to a digital output comparator along with a reference amplitude signal to create a digital threshold detect signal. An amplitude controller receives the digital threshold detect signal to create a digital control signal that drives a digitally controlled source to create the amplitude control signal.

FIG. 1 shows an integrated circuit 10 including the regulated LO buffer 100 may include the following: A LO buffer 102 receiving the unregulated LO signal 14 and a amplitude control signal 114 to create the regulated LO signal 16. A peak detector 104 receives the regulated LO signal 16 to create an analog peak signal 106 that is presented to a digital output comparator 120 along with a reference amplitude signal 108 to create a digital threshold detect signal 122. An amplitude controller 124 receives the digital threshold detect signal 122 to create a digital control signal 26 that drives a digitally controlled source 128 to create the amplitude control signal 114. This may remove noise from the regulated LO signal 16 while controlling its amplitude, preferably when the amplitude controller 124 alters the digital control signal 26 infrequently, for example no more than once a second, during initialization and/or between the reception of packets such as may be used in IEEE 802.11 based communication protocols.

Figure 2:
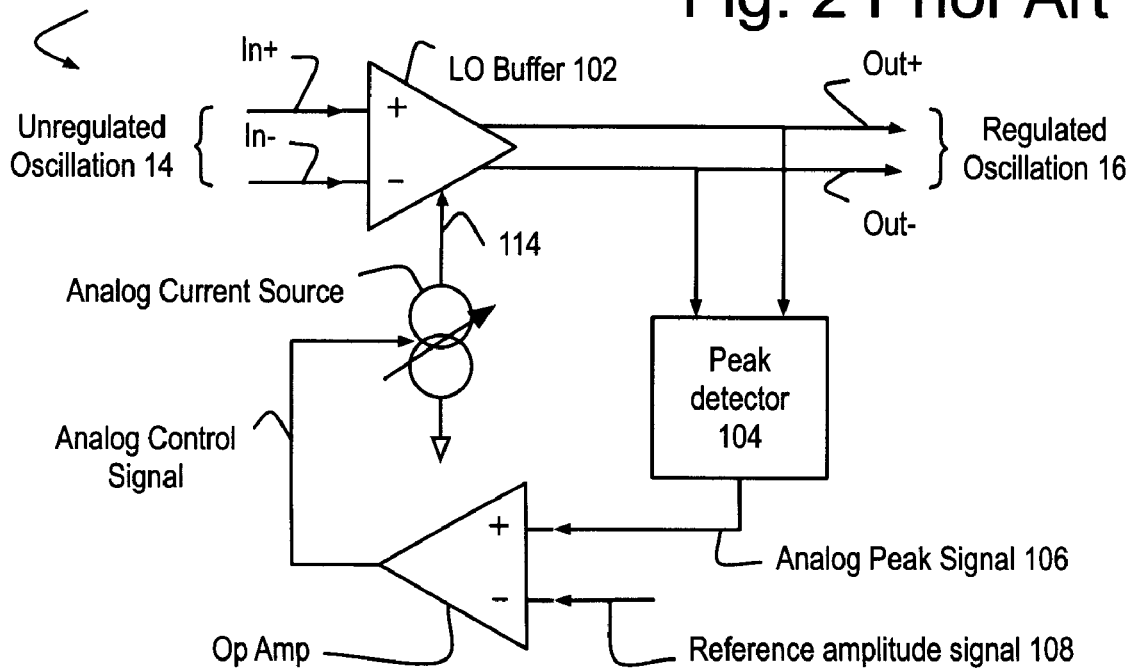
FIG. 2 shows an example of a prior art regulated LO Buffer, with the unregulated LO signal and the regulated LO signal implemented as differential signal pairs. This circuit differs from the invention by using an operational amplifier to create an analog control signal driving an analog current source to create the amplitude control signal. There are several problems with this circuit. Firstly, it does a poor job of removing DC offsets. Secondly, the operational amplifier is always turned on creating a time-varying feedback that often adds noise to the regulated LO signal, both of which can be greatly minimized in the invention's regulated LO buffer as shown in FIGS. 1 and 3.

FIG. 2 shows an example of a prior art regulated LO Buffer 100, with the unregulated LO signal 14 and the regulated LO signal 16 implemented as differential signal pairs. This circuit differs from the invention by using an operational amplifier to create an analog control signal driving an analog current source to create the amplitude control signal 114.

There are some problems with the prior art LO Buffer 102. The gain of the LO Buffer 102 may vary greatly over the manufacturing process for an integrated circuit 10 include therein. The gain may also vary greatly due to temperature variations and/or supply voltage variations. In RF designs, it is preferred to closely control the amplitude of the LO buffer. However, due to integrated circuit manufacturing process variations, operational variations (such as supply voltage and operating temperature) the gain of the LO buffers is often "over designed" to insure that in worst case scenarios, there is sufficient LO buffer output amplitude. Typically, the regulated LO signal 16 of the LO buffer 102 is coupled to a peak detector 104 to create an analog peak signal 106 that is presented to an operational amplifier for comparison with a reference amplitude signal 108.

The LO Buffer 102 may preferably be a Radio Frequency (RF) amplifier that may further receive and assert differential signals based upon an amplitude control signal 114, which previously was provided through a prior art analog feedback path shown in FIG. 2 or through a digital feedback path as shown in FIGS. 1 and/or 3. The LO buffer 102 may operate at a frequency over one Gigahertz (GH) and may further preferably operate over 4 GH, possibly around 5 GH. A problem of the prior art analog feedback path is that it is always active, which may add noise in the operating bandwidth of the regulated LO buffer 100. However, digital feedback path as shown in FIGS. 1 and 3 has the advantage in that it need only operate when clocked or triggered to operate, which may be between the reception of packets or during initialization of the integrated circuit 10, the transceiver 9 and/or the receiver 6.

Figure 3:
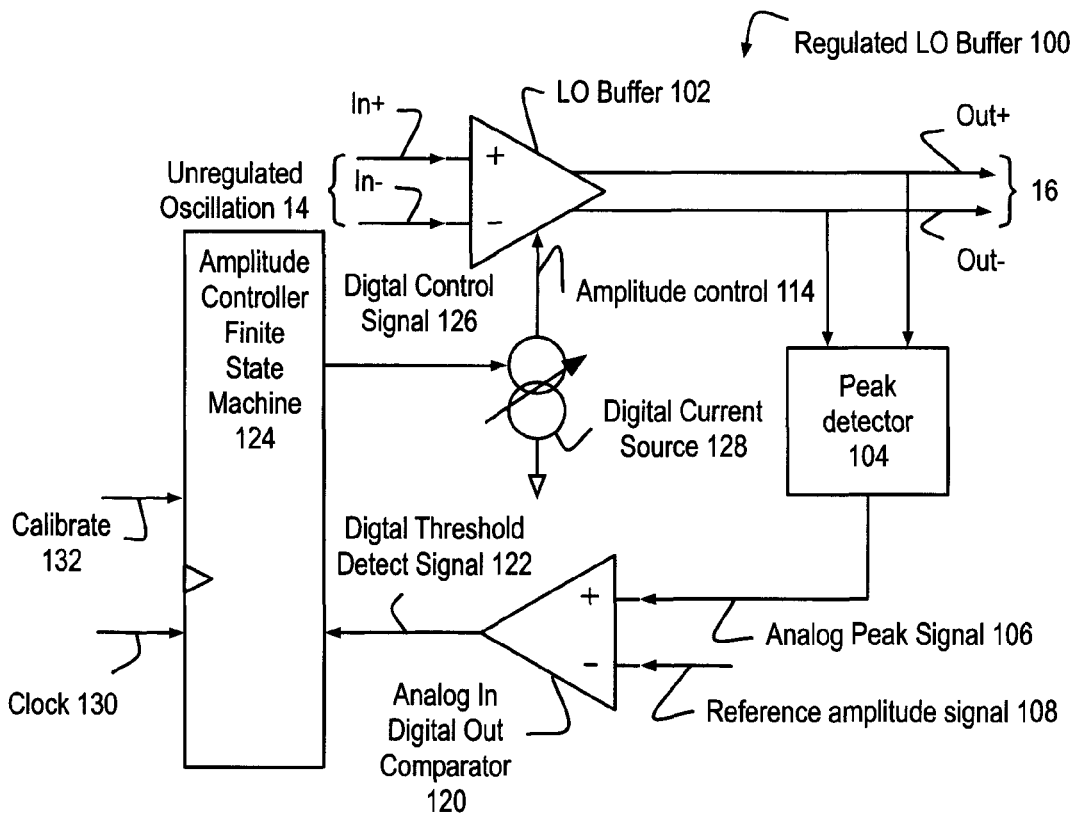
FIG. 3 shows an example of one preferred embodiment of the digital regulated LO Buffer of FIG. 1, where the unregulated LO signal and the regulated LO signal are differential signal pairs and the digitally controlled source further includes a current source, and the amplitude controller is implemented using a Finite State Machine stimulated by a clock and a calibration signal.

FIG. 3 shows an example of the digital regulated LO Buffer 100 of FIG. 1, where the unregulated LO signal 14 and the regulated LO signal 16 are differential signal pairs and the digitally controlled source 128 further includes a current source, and the amplitude controller 124 is implemented using a Finite State Machine stimulated by a clock 130 and a calibration signal 132. Note that in some embodiments, the clock and calibration signals may be combined as part of an interrupt scheme using a computer to iteratively adjust the digital control signal 126, preferably minimizing the number of digital threshold detect signal events during a calibration period.

Figure 4:
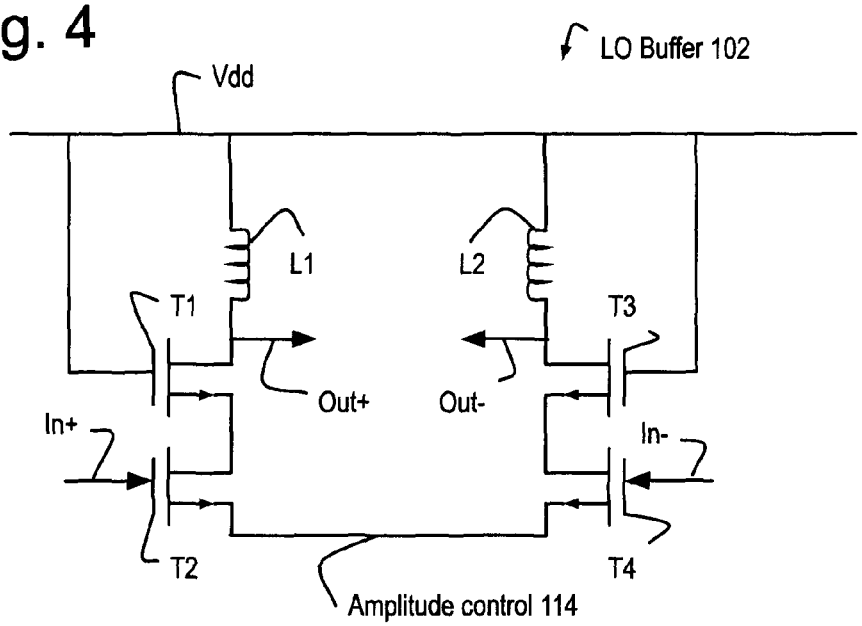
FIG. 4 shows some details of a CMOS implementation of the LO buffer of FIG. 3.

FIG. 4 shows some details of a CMOS implementation of the LO buffer 102 of FIG. 3 with Vdd representing a positive voltage above Vss, which in various embodiments may be 1.5 Volts, 3 volts, and/or 5 volts. The inductors L1 and L2 may be coupled and/or part of a transformer. The transistors T1, T2, T3 and T4 may be NMOS transistors.

Figure 5:
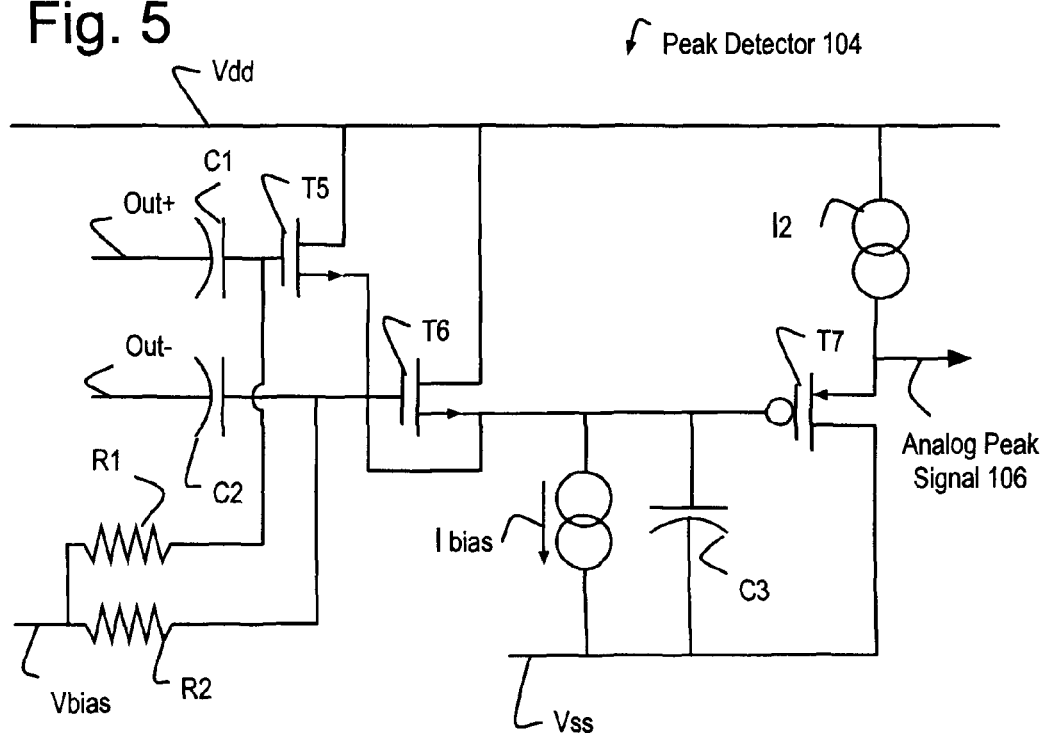
FIG. 5 shows some details of a CMOS implementation of the peak detector of FIG. 3.

FIG. 5 shows some details of a CMOS implementation of the peak detector 104 of FIG. 3 with similar meanings for Vdd and Vss. T5 and T6 may be NMOS transistors and T7 may be a PMOS transistor. The capacitors C1 and C2 may be matched and C3 may have a distinct capacitance compared to them. The resistors R1 and R2 may or may not have the same resistance to within a tolerance of ten percent or less. The $I_{bias}$ and $I_2$ current sources, combined with the other components of this circuit generate the analog peak signal 106.

Figure 6:
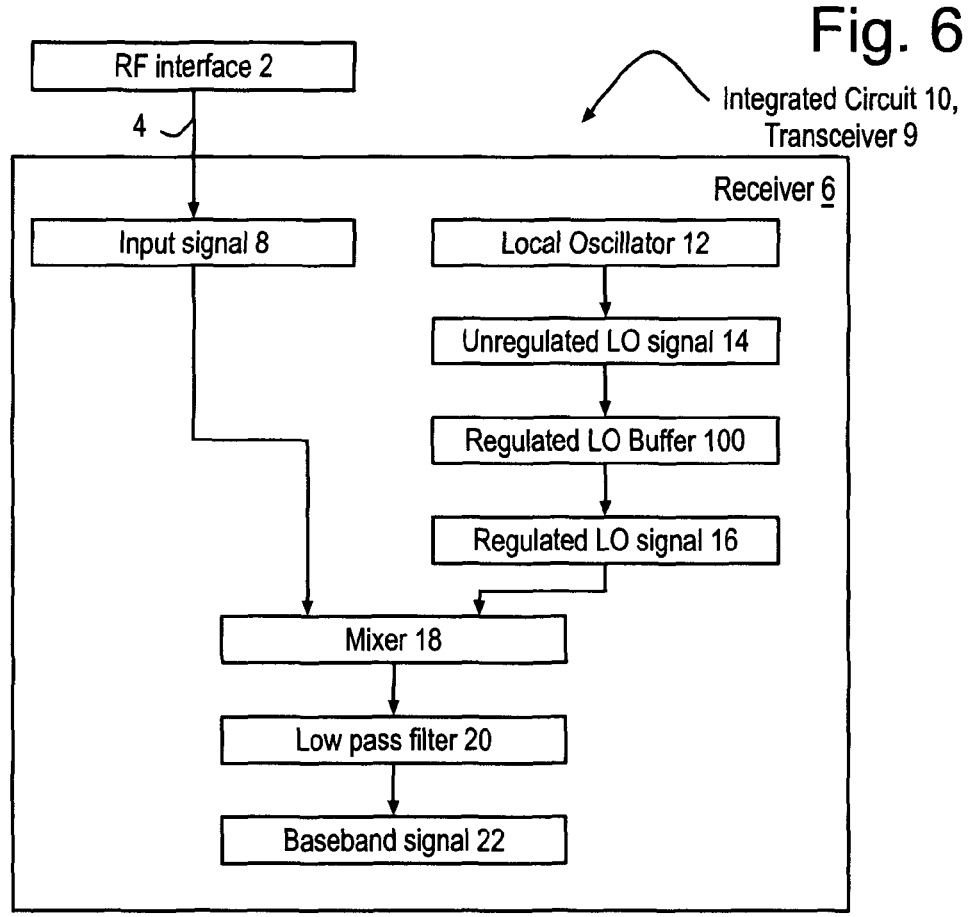
FIG. 6 shows the three hardware embodiments: an integrated circuit including a direct conversion receiver, the direct conversion receiver including a digital regulated Local Oscillator (LO) buffer, and the regulated LO Buffer. The regulated LO buffer receives an unregulated LO signal from a local oscillator to create a regulated LO signal for mixing with an input signal received from a radio frequency interface to create a baseband signal after low pass filtering.

FIG. 6 shows the three hardware embodiments: an integrated circuit 10 including a transceiver 9 that may include a direct conversion receiver 6, the direct conversion receiver 6 including a digital regulated LO buffer 100, and the regulated LO Buffer (not shown). The regulated LO buffer receives an unregulated LO signal 14 from a local oscillator 12 to create a regulated LO signal 16 for mixing 18 with an input signal 8 received from 4 a radio frequency interface 2 to create a baseband signal 22 after low pass filtering 20.

The input signal 8 may include an I signal and a Q signal. The input signal and the regulated LO signal may both include a differential signal pair. The integrated circuit 10 may be manufactured by at least one of the following processes: a MOSFET semiconductor process, a gallium arsenide process and an amorphous semiconductor process.

Figure 7A:
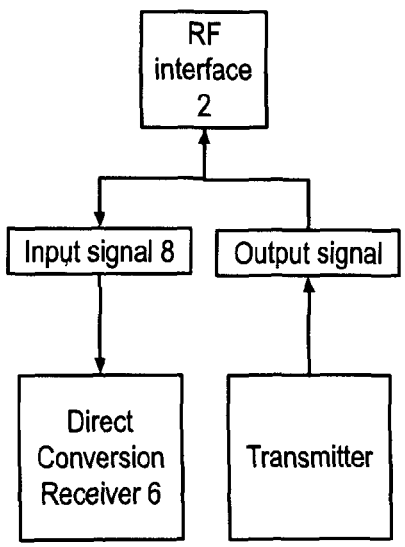
FIGS. 7A and 7B shows two embodiments of the invention as a direct conversion receiver and as a double conversion receiver as part of a transceiver including a transmitter that may share the radio interface.
Figure 7B:
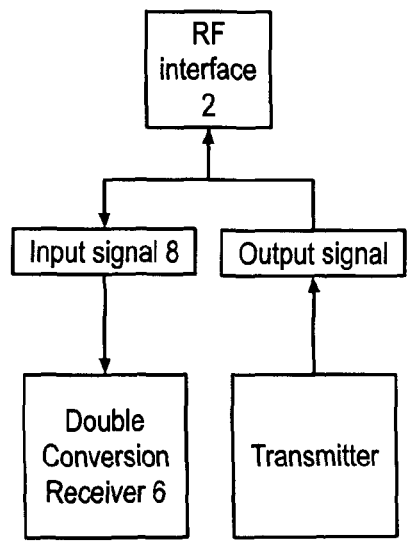

FIGS. 7A and 7B shows two embodiments of the invention where the receiver 6 implements a direct conversion receiver in FIG. 7A and implements a double conversion receiver in FIG. 7B, either of which may be part of a transceiver including a transmitter that may share the radio frequency interface 2. The direct conversion receiver may refer to a homodyne receiver. The double conversion receiver may refer to a super-heterodyne receiver.

Figure 8:
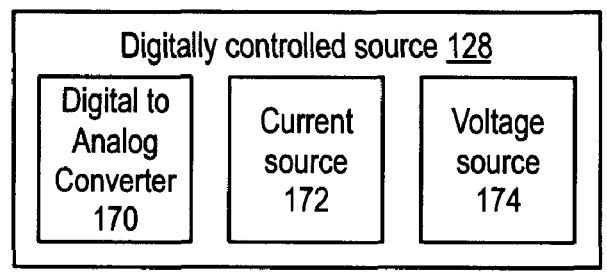
FIG. 8 shows by way of example that the digitally controlled source may include a digital to analog converter, a current source and/or a voltage source.

FIG. 8 shows by way of example that the digitally controlled source 128 may include a digital to analog converter 170, a current source 172 and/or a voltage source 174.

Figure 9:
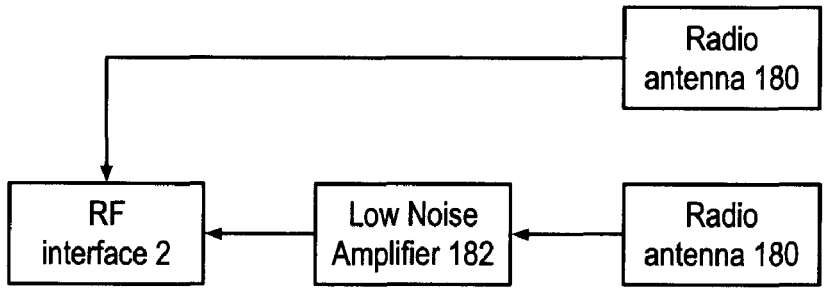
FIG. 9 shows that a radio frequency interface may be configured to communicate using a radio antenna and/or a low noise amplifier.

FIG. 9 shows the radio frequency interface 2 may be configured to communicate using at least one of the following: a radio antenna 180, a low noise amplifier 182. Any of these components that are used may be included in the radio frequency interface.

Figure 10:
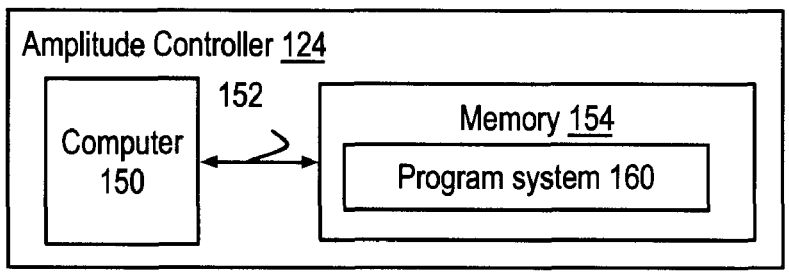
FIG. 10 shows an example of the amplitude controller including an instance of a computer accessibly coupled to a computer readable memory and instructed by a program system.

FIG. 10 shows an example of the amplitude controller 124 including a computer 150 accessibly coupled 152 to a computer readable memory 154 and instructed by a program system 160. As used herein, a computer includes at least one data processor and at least one instruction processor instructed by a program system, where each of the data processors is instructed by at least one of the instruction processors and at least one of the data processors supports implementation of this invention by its controller. Also as used herein, a finite state machine receives at least one input, maintains and updates at least one state and generates at least one output based upon the value of at least one of the inputs and/or the value of at least one of the states.

The following figure shows a flowchart of at least one embodiment of the invention's methods. The arrows may signify a flow of control, and sometimes data, supporting various implementations. These may include a program operation, or program thread, executing upon the computer or states of a finite state machine. Each of these program steps may at least partly support the operation to be performed. Other circuitry such as radio components, specialized encoders and/or decoders, memory management and so on may also be involved in performing the operation.

The operation of starting the flowchart may refer to entering a subroutine or a macro instruction sequence in the computer or entering a possibly initial state or condition of the finite state machine.

The operation of termination in the flowchart may refer to completion of those operations, which may result in a subroutine return in the computer or possibly return the finite state machine to a previous condition or state. A rounded box with the word "Exit" in it denotes the operation of terminating the flowchart.

Figure 11:
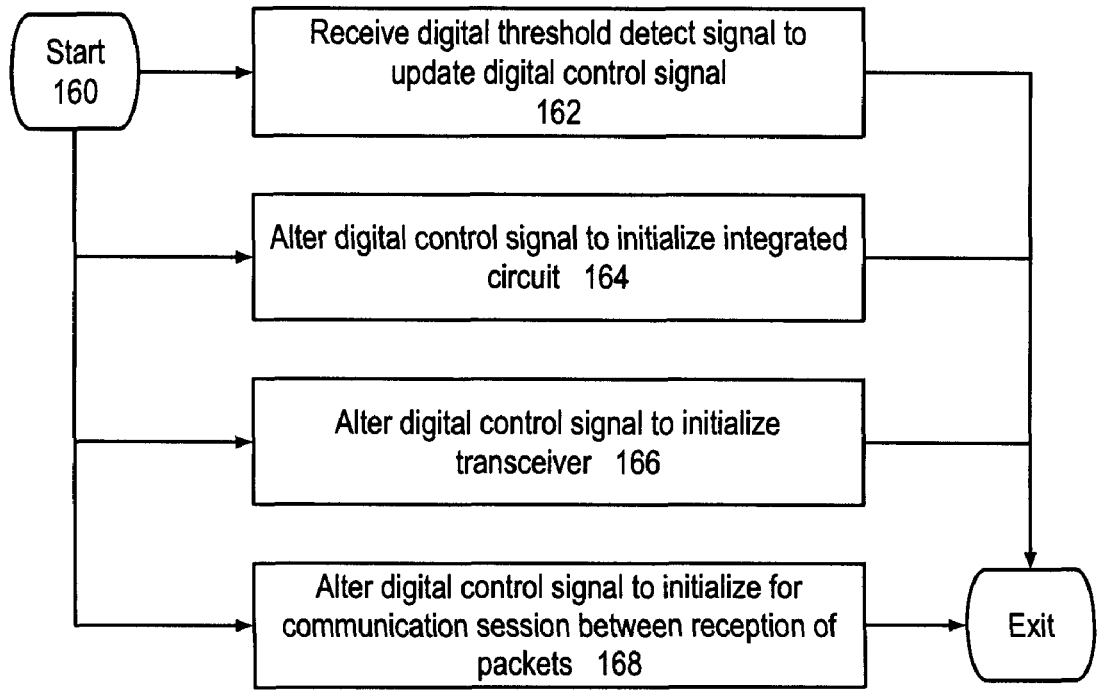
FIG. 11 shows the program system support of at least one of receiving the digital threshold detect signal to update the digital control signal, altering the digital control signal possibly during initialization of the integrated circuit, initialization of the transceiver and/or for a communication session between reception of packets.

FIG. 11 shows some details of the program system 160 that may include at least one of the following: Program step 162 supports for receiving a digital threshold detect signal 122 to update the digital control signal 26. The program step may be executed infrequently enough to make the process essentially digital current during the active operation of the receiver 6. Program step 164 supports altering the digital control signal to initialize the integrated circuit 10. Program step 166 supports altering the digital control signal to initialize the transceiver 9, possibly the receiver 6. And program step 168 supports altering the digital control signal to initialize a communication session between packet receptions.

The preceding embodiments provide examples of the invention, and are not meant to constrain the scope of the following claims.

What is claimed is:

1. A regulated Local Oscillator (LO) buffer, comprising:
a LO buffer configured to receive an unregulated LO signal to create a regulated LO signal based upon a gain;
a peak detector receiving said regulated LO signal to create an analog peak signal;
a digital output comparator receiving said analog peak signal and a reference amplitude level to create a digital threshold detect signal;
an amplitude controller receiving said digital threshold detect signal to assert a digital control signal; and
a digitally controlled source receiving said digital control signal to generate an amplitude control to control said gain.

2. The regulated LO buffer of claim 1, wherein said unregulated LO signal and said regulated LO signal includes a differential signal pair.

3. The regulated LO buffer of claim 1, wherein said amplitude controller includes at least one instance of at least one member of the group consisting of a finite state machine and a computer.

4. The regulated LO buffer of claim 1, wherein said amplitude controller alters said digital control signal no more than once a second.

5. The regulated LO buffer of claim 1, wherein said amplitude controller alters said digital control signal in response to at least one member of the group consisting of initializing an integrated circuit containing said regulated LO buffer, initializing a transceiver using said regulated LO signal and initializing a communication session between reception of packets.

6. The regulated LO buffer of claim 1, wherein said digitally controlled source includes at least one member of the group consisting of a digital to analog converter, a current source and a voltage source.

7. A receiver, comprising:
a Local Oscillator (LO) generating an unregulated LO signal;
a regulated LO buffer for receiving said unregulated LO signal to create a regulated LO signal; and
a mixer receiving an input signal from a radio frequency interface and said regulated LO signal at least partly create a baseband signal from said input signal;
wherein said regulated LO buffer comprises
a LO buffer receiving said unregulated LO signal and an amplitude control to create said regulated LO signal;
a peak detector receiving said regulated LO signal to create an analog peak signal;
a digital output comparator receiving said analog peak signal and a reference amplitude level to create a digital threshold detect signal;
an amplitude controller receiving said digital threshold detect signal to assert a digital control signal; and
a digitally controlled source receiving said digital control signal to generate said amplitude control.

8. The receiver of claim 7, wherein said input signal and said regulated LO signal both include a differential signal pair.

9. The receiver of claim 7, wherein said amplitude controller includes at least one instance of at least one member of the group consisting of: a finite state machine and a computer.

10. The receiver of claim 7, wherein said amplitude controller alters said digital control signal no more than once a second.

11. The receiver of claim 7, wherein said amplitude controller alters said digital control signal in response to at least one member of the group consisting of initializing said regulated LO buffer, initializing said receiver, and initializing a communication session using said radio frequency interface and between reception of packets.

12. The receiver of claim 7,
wherein said radio frequency interface is configured to communicate using at least one member of the group consisting of: a radio antenna, a low noise amplifier; and
wherein said digitally controlled source includes at least one member of the group consisting of a digital to analog converter, a current source and a voltage source; and
wherein said receiver implements a member of the group consisting of a direct conversion receiver and a double conversion receiver.

13. An integrated circuit, comprising:
at least one regulated LO buffer comprising
a LO buffer receiving an unregulated LO signal and an amplitude control to create a regulated LO signal;
a peak detector receiving said regulated LO signal to create an analog peak signal;
a digital output comparator receiving said analog peak signal and a reference amplitude level to create a digital threshold detect signal;
an amplitude controller receiving said digital threshold detect signal to assert a digital control signal;
a digitally controlled source receiving said digital control signal to generate said amplitude control.

14. The integrated circuit of claim 13, wherein said amplitude controller includes at least one instance of at least one member of the group consisting of a finite state machine and a computer.

15. The integrated circuit of claim 13, wherein said integrated circuit is manufactured by at least one member of the group consisting of a MOSFET semiconductor process, a gallium arsenide semiconductor process and an amorphous semiconductor process.

16. The integrated circuit of claim 13, wherein said amplitude controller alters said digital control signal no more than once a second.

17. The integrated circuit of claim 13, further comprising a transceiver using said regulated LO signal.

18. The integrated circuit of claim 13, further comprising:
a radio frequency interface;
a receiver coupled to said radio frequency interface to create an input signal and including
a Local Oscillator (LO) generating an unregulated LO signal;
said regulated LO buffer for receiving said unregulated LO signal to create said regulated LO signal; and
a mixer receiving said input signal and said regulated LO signal at least partly create a baseband signal from said input signal.

19. The integrated circuit of claim 18, wherein said amplitude controller alters said digital control signal in response to at least one member of the group consisting of initializing said receiver, initializing said integrated circuit, initializing a communication session using said radio frequency interface and between reception of packets.

20. The integrated circuit of claim 18,
wherein said radio frequency interface is configured to communicate using at least one member of the group consisting of: a radio antenna, a low noise amplifier; and
wherein said digitally controlled source includes at least one member of the group consisting of a digital to analog converter, a current source and a voltage source.

21. The integrated circuit of claim 18, wherein said receiver implements a member of the group consisting of a direct conversion receiver and a double conversion receiver.

22. The integrated circuit of claim 18, wherein said input signal and said regulated LO signal both include a differential signal pair.

* * * * *